United States Patent [19]
Janik

[11] Patent Number: 6,108,197
[45] Date of Patent: *Aug. 22, 2000

[54] FLEXIBLE WEARABLE COMPUTER

[75] Inventor: Craig M. Janik, Palo Alto, Calif.

[73] Assignee: ViA, Inc., Northfield, Minn.

[ * ] Notice: This patent is subject to a terminal disclaimer.

[21] Appl. No.: 09/138,797

[22] Filed: Aug. 24, 1998

Related U.S. Application Data

[63] Continuation of application No. 08/759,846, Dec. 2, 1996, Pat. No. 5,798,907, which is a continuation of application No. 08/600,669, Feb. 13, 1996, Pat. No. 5,581,492, which is a continuation of application No. 08/192,636, Feb. 7, 1994, Pat. No. 5,491,651, which is a continuation-in-part of application No. 07/884,117, May 15, 1992, Pat. No. 5,285,398.

[51] Int. Cl.[7] ....................................................... G06F 1/16
[52] U.S. Cl. ............................................................ 361/683
[58] Field of Search .......................... 361/683; 364/708.1

[56] References Cited

U.S. PATENT DOCUMENTS

| | | |
|---|---|---|
| 2,156,504 | 5/1939 | Liss . |
| 3,588,359 | 6/1971 | Cribb . |
| 3,744,025 | 7/1973 | Bilgutay . |
| 3,876,863 | 4/1975 | Boone . |
| 3,956,740 | 5/1976 | Jones et al. . |
| 4,087,864 | 5/1978 | LaBove et al. . |
| 4,096,577 | 6/1978 | Ferber et al. . |
| 4,104,728 | 8/1978 | Kasubuchi . |
| 4,254,451 | 3/1981 | Cochran, Jr. . |
| 4,364,112 | 12/1982 | Onodera et al. . |
| 4,533,188 | 8/1985 | Miniet . |

(List continued on next page.)

FOREIGN PATENT DOCUMENTS

| | | |
|---|---|---|
| 0 251 643 A2 | 1/1988 | European Pat. Off. . |
| 0 264 956 A2 | 4/1988 | European Pat. Off. . |
| 0 531 645 A2 | 3/1993 | European Pat. Off. . |
| 56-74765 | 6/1981 | Japan . |
| 60-204056 | 10/1985 | Japan . |
| 2-177395 | 7/1990 | Japan . |
| 2-108164 U | 8/1990 | Japan . |
| 6-302930 | 10/1994 | Japan . |
| 1887091 | 3/1975 | United Kingdom . |
| WO 88/07659 | 10/1988 | WIPO . |
| WO 93/23801 | 11/1993 | WIPO . |
| WO 96/07143 | 3/1996 | WIPO . |
| WO 96/07921 | 3/1996 | WIPO . |
| WO 96/07924 | 3/1996 | WIPO . |

OTHER PUBLICATIONS

"Wearable Interconnection for Portable Computers"; IBM Technical Disclosure Bulletin; vol. 34, No. 10B, Mar. 1992, p. 30.

Helm, Leslie; "Japan Turns Fanciful in the Evolution of Computers;" Los Angeles Times; Oct. 14, 1991; Business Section; p. 1, Part D. column 2.

"Die Hände werden frei"; Nachrichten Elektronik und Telematrik; vol. 44, No. 4, Apr. 1990, Heidelberg DE, p. 154.

"Wearable Interconnection for Portable Computers"; IBM Technical Disclosure Bulletin; vol. 34, No. 10B, Mar. 1992, p. 30.

Helm, Leslie; "Japan Turns Fanciful in the Evolution of Computers;" Los Angeles Times; Oct. 14, 1991; Business Section; p. 1 Part D. col. 2.

"Die Hände werden frei"; Nachrichten Elektronik und Telematrik; vol. 44, No. 4, Apr. 1990, Heidelberg DE, p. 154.

*Primary Examiner*—Leo P. Picard
*Assistant Examiner*—John D. Reed
*Attorney, Agent, or Firm*—Patterson & Keough, P.A.

[57] ABSTRACT

A wearable computing device includes computing-device component modules and flexible circuitry passing into the modules. The modules can include a top module portion and a bottom module portion, the flexible circuitry passing between the top and bottom portions. Wireless communication, e.g. by radio frequency, with a peripheral and/or a local area network is also contemplated.

29 Claims, 14 Drawing Sheets

U.S. PATENT DOCUMENTS

| | | |
|---|---|---|
| 4,545,023 | 10/1985 | Mizzi . |
| 4,607,156 | 8/1986 | Koppenaal et al. . |
| 4,633,881 | 1/1987 | Moore et al. . |
| 4,690,653 | 9/1987 | Goldberg . |
| 4,692,840 | 9/1987 | Ellis . |
| 4,719,462 | 1/1988 | Hawkins . |
| 4,756,940 | 7/1988 | Payne et al. . |
| 4,768,971 | 9/1988 | Simpson . |
| 4,825,471 | 5/1989 | Jennings . |
| 4,827,534 | 5/1989 | Haugen . |
| 4,845,650 | 7/1989 | Meade et al. . |
| 4,858,071 | 8/1989 | Manabe et al. . |
| 4,882,685 | 11/1989 | vander Lely . |
| 4,885,430 | 12/1989 | Kinser, Jr. et al. . |
| 4,899,039 | 2/1990 | Taylor et al. . |
| 4,916,441 | 4/1990 | Gombrich . |
| 4,949,224 | 8/1990 | Yamamura et al. . |
| 4,958,260 | 9/1990 | Kobayashi et al. . |
| 5,003,300 | 3/1991 | Wells . |
| 5,007,427 | 4/1991 | Suzuki et al. . |
| 5,024,360 | 6/1991 | Rodriguez . |
| 5,035,242 | 7/1991 | Franklin et al. . |
| 5,051,366 | 9/1991 | Anderson et al. . |
| 5,067,907 | 11/1991 | Shotey . |
| 5,078,134 | 1/1992 | Heilman et al. . |
| 5,105,067 | 4/1992 | Brekkestran et al. . |
| 5,123,850 | 6/1992 | Elder et al. . |
| 5,144,120 | 9/1992 | Krichever et al. . |
| 5,158,039 | 10/1992 | Clark . |
| 5,170,326 | 12/1992 | Meny et al. . |
| 5,181,181 | 1/1993 | Glynn . |
| 5,208,449 | 5/1993 | Eastman et al. . |
| 5,209,260 | 5/1993 | Rollason . |
| 5,220,488 | 6/1993 | Denes . |
| 5,267,181 | 11/1993 | George . |
| 5,272,324 | 12/1993 | Blevins . |
| 5,278,730 | 1/1994 | Kikinis . |
| 5,285,398 | 2/1994 | Janik . |
| 5,305,181 | 4/1994 | Schultz . |
| 5,305,244 | 4/1994 | Newman et al. . |
| 5,306,162 | 4/1994 | Armendariz . |
| 5,311,402 | 5/1994 | Kobayashi et al. . |
| 5,319,526 | 6/1994 | Takashima . |
| 5,329,106 | 7/1994 | Hone et al. . |
| 5,349,500 | 9/1994 | Casson et al. . |
| 5,373,421 | 12/1994 | Detsikas et al. . |
| 5,402,077 | 3/1995 | Agahdel et al. . |
| 5,416,310 | 5/1995 | Little . |
| 5,416,730 | 5/1995 | Lookofsky ............................ 364/708.1 |
| 5,422,514 | 6/1995 | Griswold et al. . |
| 5,548,481 | 8/1996 | Salisbury et al. . |
| 5,555,490 | 9/1996 | Carroll ..................................... 361/683 |
| 5,581,492 | 12/1996 | Janik . |
| 5,719,744 | 2/1998 | Jenkins et al. ........................... 361/683 |
| 5,764,164 | 6/1998 | Cartabiano et al. ................. 364/708.1 |
| 5,774,338 | 6/1998 | Wessling, III ........................... 361/686 |
| 5,798,907 | 8/1998 | Janik . |
| 5,931,764 | 8/1999 | Freeman et al. ..................... 364/708.1 |

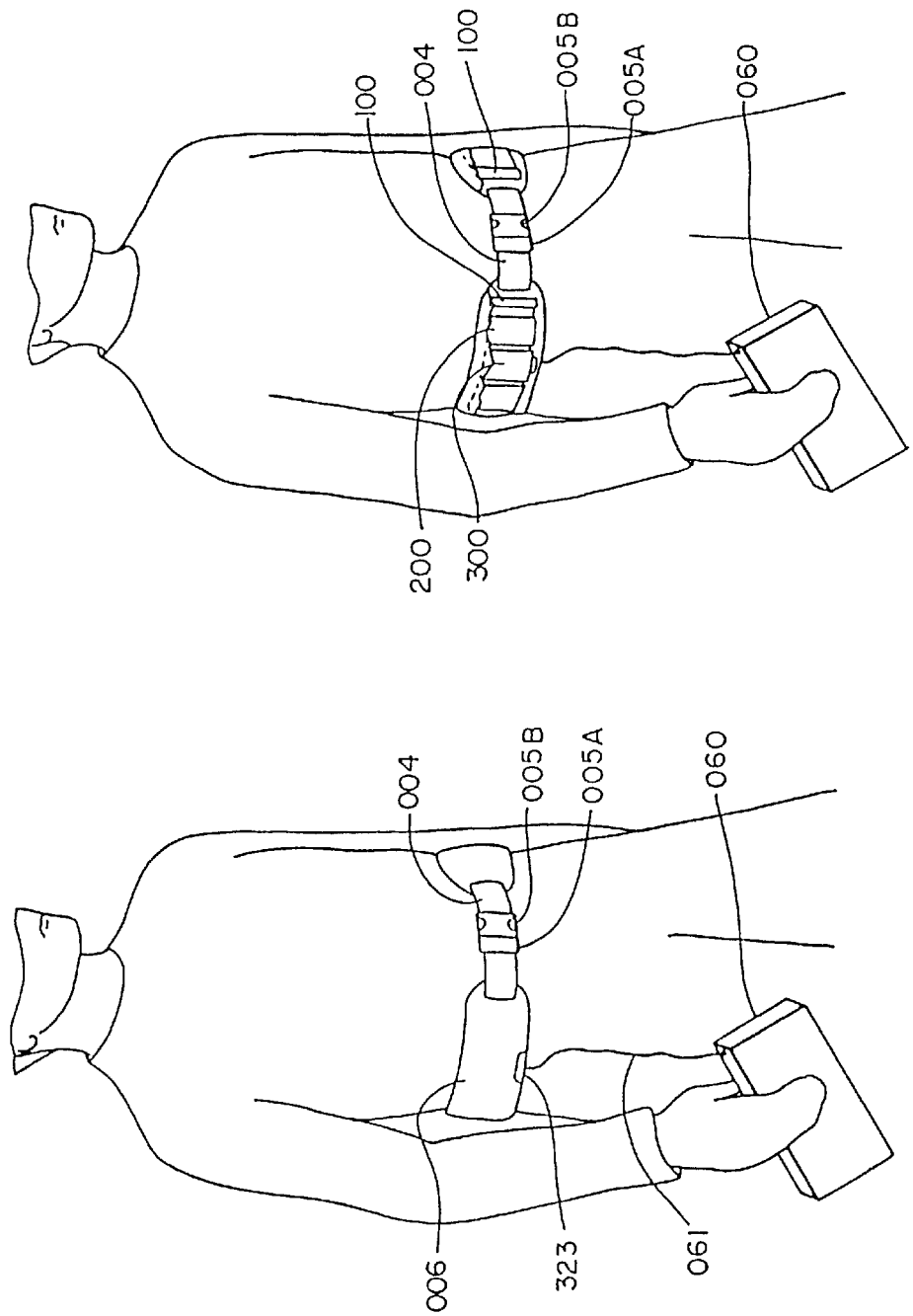

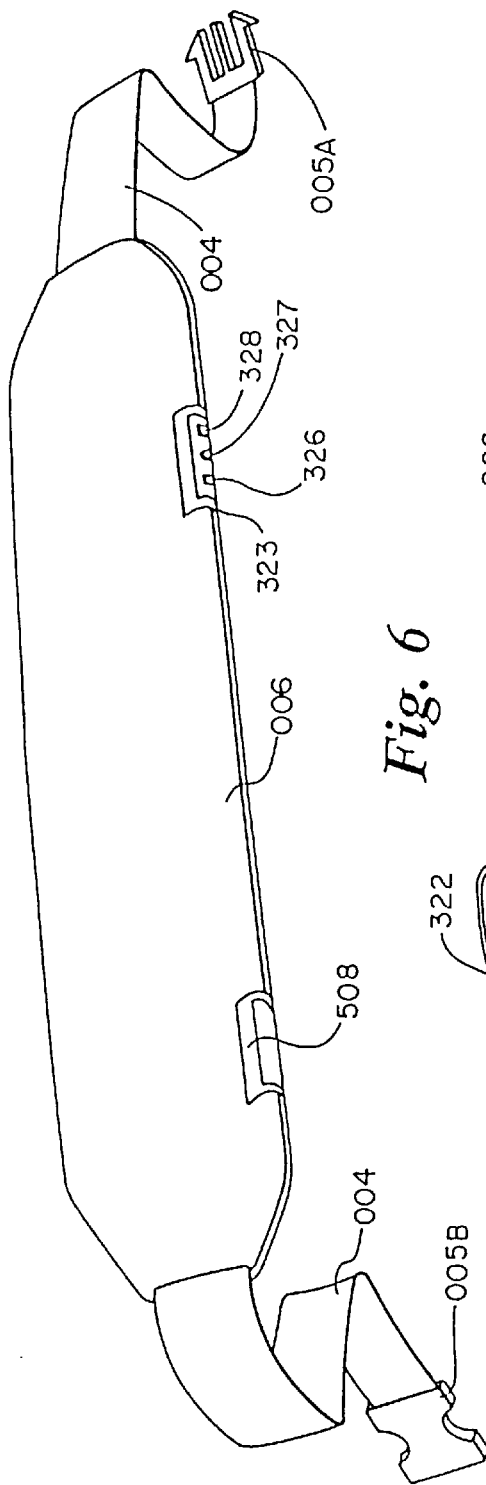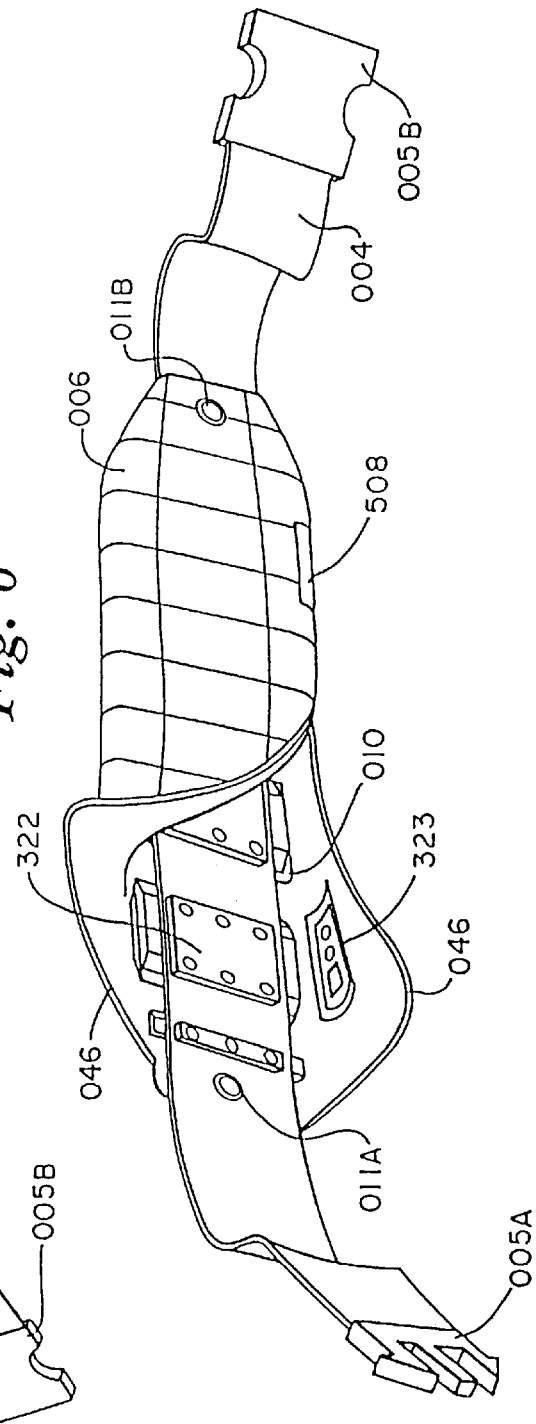

FLEXIBLE WEARABLE COMPUTER

This is a Continuation of Application No. 08/759,846 filed Dec. 2, 1996, now U.S. Pat. No. 5,798,907, which in turn is a Continuation of Application No. 08/600,669 filed Feb. 13, 1996, now U.S. Pat. No. 5,581,492, which in turn is a Continuation of Application No. 08/192,636 filed Feb. 7, 1994, now U.S. Pat. No. 5,491,651, which in turn is a Continuation-In-Part of Application No. 07/884,117, filed May 15, 1992, now U.S. Pat. No. 5,285,398.

BACKGROUND

1. Field of Invention

This invention relates generally to the field of portable computers, and more specifically to a flexible, wearable computer that can be worn on the body and repeatedly bent in an infinite number of planes without failure of operation.

2. Description of Related Art

Definitions

A computer system is defined as comprising three basic components: an input device, an output device, and a computer. A computer is defined as comprising memory, a processor, and associated support circuitry and components. Memory comprises main memory which is volatile, and mass storage memory which is usually nonvolatile. A portable computer system is one that the user can easily carry around. Throughout this text the author will refer to a computer to mean only and specifically the main and secondary storage memory, the processor, and a power supply. The author will also use volume to characterize both the size and the mass of computers. This is because the overall density of silicon-based computers is asymptotic to a constant. Therefore, volume will necessarily indicate a maximum weight.

Integration

Small and therefore portable computers have resulted from the intersection of innovations and inventions across a wide variety of domains and fields including the arts of silicon manipulation, and mechanical and electrical design, and component integration. Integration is the process of decreasing the size of and the space between electrical elements, and it has been the pathway to power reduction and speed But size reduction accrued benefits independent of processing power. Computers that once required buildings to house and small power plants to run can now be comfortably lifted with one hand. Since integration and therefore miniaturization has brought nearly all of the advances in service levels to date, it is the major force in the creation of the prior art in portable computing and the direction of future advancement for computer construction in general.

There has been tremendous innovation and invention using integration as a means of making computers portable. Computers are available that are small enough to be lifted by one finger. The result has been explosive demand for portable computing devices. Dataquest predicts that by 1994 sales of portable computing devices will be well over $13 billion (Byte, volume 16, number II, p. 194).

"Picocomputers" are the state of the art of integration as a means of creating portable computers (New York Times, Mar. 23, 1992). Inventors such as M. E. Jones, Jr. have developed a single chip that contain all of the elements needed for a computer. This has allowed creation of computer systems that can fit in the breast pocket of a man's jacket and run for 100 hours on a conventional flashlight battery. The major limitations of these computer systems is that they have very small amounts of memory greatly limiting the usefulness of the device for tasks to which most computer users are accustomed. They also have very small input and output devices which are slow and inconvenient to use.

Useful Portables

Other innovations include computers with increased processing abilities that must be carried with one hand. These rigid rectilinear-shaped devices fall into the classes lap-top, palm-top or hand-held computers and increase the processing and memory capacity of the picocomputer by including the required processors and memory power in a larger enclosure. For the episodic portable commuter user that spends little time actually carrying these devices, these rigid rectilinear devices provide high levels of service rivaling desk-top micro and minicomputers. For the intensive user that processes large amounts of data and must also carry the computer for long periods time, these devices have several disadvantages.

First, research has shown that people carrying these computers for long periods of time are prone to flexi carpi ulnaris tendonitis which can be painful and debilitating. This affliction is due to prolonged and simultaneous clenching of the fingers and flexing of the wrist, an action unavoidable when carrying these devices.

Second, for intensive data acquisition applications, size once again is a constraint. The amount of secondary memory required for implementation makes this option impractical for portable computers in rigid rectilinear packaging. On-board memory requirements have been sidestepped by including wireless data links to a host computer for downloading data. However, these options are very costly, up to the cost of the computer itself, and increase the volume of the devices by as much as a factor of two. Furthermore, wireless communication is presently a very slow data transfer process.

Third, field service research for Rockwell International has demonstrated that user compliance of rigid rectilinear hand-carried and hand-held computers is low, and gets lower as the size of the device increases. Field service personnel expressed considerable displeasure with having to lug a "brick" around during the execution of their task. Most notably it restricted the use of their hands by virtue of one, or both being used to carry the computer.

Wearable Portables

There has been innovation and invention to harness rigid rectilinear computers on various parts of the body. Reddy Information Systems Inc. has produced a computer called Red FIG. 1 that has a head mounted output device (A) from Reflection Technologies called the Private Eye, and a belt-mounted rigid rectilinear-packaged computer and input device (B) secured by a belt harness (C) (New York Times, Mar. 29, 1992). Infogrip Inc. and Select Tech Inc. have combined technologies to produce the Hip Pc in a similar configuration.

There are two main disadvantages to this approach. First, harnessing a rigid rectilinear-packaged computer anywhere on the body creates an uneven load on the spine. Prolonged wearing of such devices creates strain in the supporting muscles opposite the place where the computer is harnessed. Second, these configurations do not allow the human body to comfortably contact a firm surface. The rigid rectilinear computer on a harness or belt is literally a lump on the surface of the body. Lastly, rigid rectilinear designs are inherently limited in expandability. To increase processing power, hardware size must be increased. There is a volume limit beyond which the computer is no longer portable.

There has been innovation and invention to make computers more comfortable to wear. Hideji Takemasa of NEC Corp. has created a variety of rigid curvilinear-packaged computer models that conform to various parts of the body FIG. 2 (Fortune, Jan. 13, 1992). These devices include a processor and CD-ROM reader (D), and a fold out input/output device (E,F). Although aesthetically more appealing than the rigid rectilinear lumps of the Red and Hip PC models, the NEC models nonetheless suffer the same disadvantages. The NEC curvilinear designs are rigid and dynamically nonconforming and subject the spine to uneven loading. They also do not allow comfortable contact of the human body with firm surfaces. Furthermore, these rigid, curvilinear designs must be made in many sizes since it is technically impossible to make one of these designs fit all human morphologies. They are also inherently limited in expandability just as the rigid rectilinear designs.

SUMMARY OF INVENTION

According to embodiments of the present invention, a wearable computing device includes computing-device modules and flexible circuitry passing into the modules. The modules can include a top module portion and a bottom module portion, the flexible circuitry passing between the top and bottom portions. Wireless communication, e.g. by radio frequency, with a peripheral and/or a local area network is also contemplated.

The present invention exemplifies a new and unobvious art of a flexible wearable computer. Briefly and generally, the flexible wearable computer comprises a microprocessor, memory, an input/output controller, and a power supply operably associated with one another through a flexible signal relaying means. The assembly is supported by a tensile load bearing means and protected by a compressive load bearing means. The microprocessor, memory, input/output controller, and power supply are mechanically associated in a module assembly such that the flexible wearable computer can bend in an infinite number of planes without failure of operation.

OBJECTS AND ADVANTAGES

The most important advantage of the flexible wearable computer is that it will always provide greater utility than rigid designs for those users that must carry their computer around while processing large amounts of data, regardless of the state of the art of integration and miniaturization. That is, regardless of how much computer power can be delivered in a given rigid package, providing a flexible wearable computer allows more of that computer power to be comfortably carried by the user. For example, even if a Cray super computer can be reduced to the size of a wrist watch, the intensive computer user will find more utility in a flexible computer that is an array of the microprocessors in the wristwatch-sized Cray that is fashioned for instance as a comfortable vest.

This relationship can be mathematically demonstrated with a common market model adapted for computer power demand. Refer now to equation (1)

$$Q = c - aP + bS \quad (1)$$

where,

Q=total amount of computers demanded in a specified context;

P=the price of computers sold in the marketplace for that context;

S=the service level provided by computers in that context.

The service level of a computer for any specified context is related to the number of useful operations per second (UOPS). This value is driven by several factors including the elegance of the program, memory size and access time, and raw processing speed. Service level is also related to volume. Volume is less critical when a user does not need to carry the computer. It becomes a major determinant when a user must be ambulatory while using a computer.

Service level can be defined as $$S = \left(\frac{UOPS}{V_H}\right)\left(\frac{F}{person}\right) \quad (2)$$

where, $F = \min\{V_H, V_I\}$;

$V_H$ = volume of the hardware;

$\left(\frac{UOPS}{V_H}\right)$ = power density and is roughly constant. That is, the greater the UOPS, the larger the volume of the hardware.

$V_I$ = the constrained volume of user interface, that is, the largest hardware volume the user can employ to accomplish a specific computing task;

person = the number of individuals that must use the hardware.

For the majority of computing applications volume is irrelevant. Equations (1) and (2) mathematically describe this observation. In these contexts, the user is unconstrained by the volume of the hardware, and $V_I$ is infinity making F equal to $V_H$. Volume hence has no influence on the service level (5) and therefore no influence on the quantity ((2) of computers demanded.

However, for users that desire to or must carry a computer around, the volume of the hardware becomes critical. Equations (1) and (2) mathematically describe this observation also. There exists for any rigid form factor a maximum volume ($V_I$) beyond which the user cannot carry a computer. (F) is then equal to ($V_I$). Hence, increasing the power density is the only means to increase service level and therefore quantity demanded.

Now it is clear from equation (2) that if $V_I$ can be increased, $V_H$ can also be increased thus increasing the UOPS obtainable. This can be done without increasing power density. The flexible wearable computer directly increases $V_I$ compared to rigid packaging schemes because it allows hardware to be shaped like articles of clothing allowing the more comfortably placement of larger volumes of hardware on various areas of the body. It obviates the need to carry the entire hardware in one or both hands. It also eliminates the uncomfortable nature of strapping a rigid device onto one aspect of the body. It also eliminates the need to make a variety of sizes such as the rigid curvilinear designs require.

Another advantage of the flexible wearable form factor is that by implementing a computer as many small rigid elements instead of one large rigid element, the bending moment across each element is smaller since the area of each element is decreased. The bending moment is caused when a rigid element is worn against the body and the body comes into contact with any firm surface. Distributed or concentrated loads are applied normal to the surface of the element. An example would be when a wearer sat down in a chair. The firm elements of the chair would exert forces against the rigid elements.

Further objects and advantages of the present invention are:

(a) To provide a flexible wearable computer that can be shaped into a limitless variety of shapes and sizes.

(b) To provide a flexible wearable computer that can accommodate a wide variety of human morphologies.

(c) To provide a flexible wearable computer that allows comfortable hands-free portability.

(d) To provide a flexible wearable computer that symmetrically distributes its volume and therefore evenly loads the spine.

(e) To provide a flexible wearable computer that eliminates flexi carpi ulnaris tendonitis.

(f) To provide a flexible wearable computer that is comfortable to wear while the human body is against a firm surface.

(g) To provide a flexible wearable computer that increases the compliance of field service users by allowing hands-flee portability without sacrificing comfort.

(h) To provide a flexible wearable computer whereby the computer can be more comfortably carried and operated than an integrated computer of comparable processing power in a rigid rectilinear or curvilinear packages.

(i) To provide a flexible wearable computer that data transfer rates that are faster than wireless communication systems.

(j) To provide a flexible wearable computer that can more easily and comfortably be expanded than rigid package designs.

(k) To increase the ruggedness of a wearable computer by decreasing the size and thus the bending moment across any rigid elements.

Other objects and advantages of the present invention and a full understanding thereof may be had by referring to the following detailed description and claims taken together with the accompanying illustrations. The illustrations are described below in which like parts are given like reference numerals in each of the drawings.

DRAWING FIGURES

FIG. 3 is a view of a user wearing the preferred embodiment of the flexible wearable computer system which by definition includes an input/output device.

FIG. 4 is a view of a user wearing the flexible wearable computer system with the outer sheath ghosted.

FIG. 5 is a perspective view of the preferred embodiment of the flexible wearable computer which by definition does not include the input/output device.

FIG. 6 is a perspective view of the flexible wearable computer showing the surface that contacts the body with the outer sheath partially removed.

Figure 2:
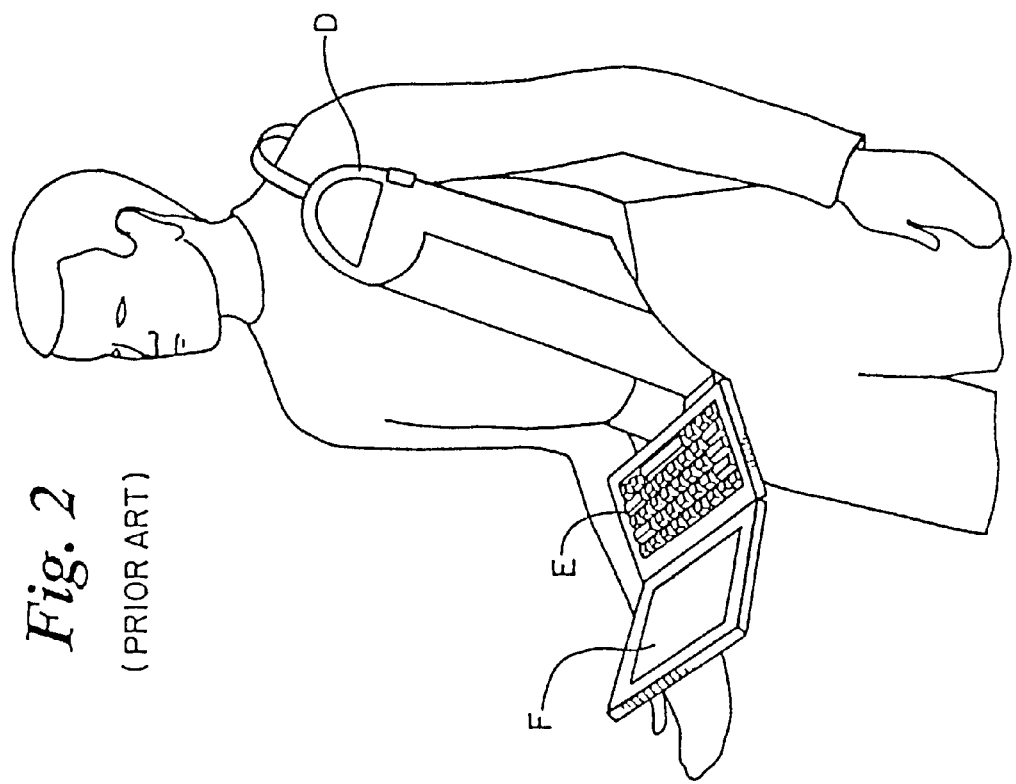
FIG. 2 is a perspective view of the prior art of a wearable portable computer system by Takemasa of NEC Corporation.
Figure 1:
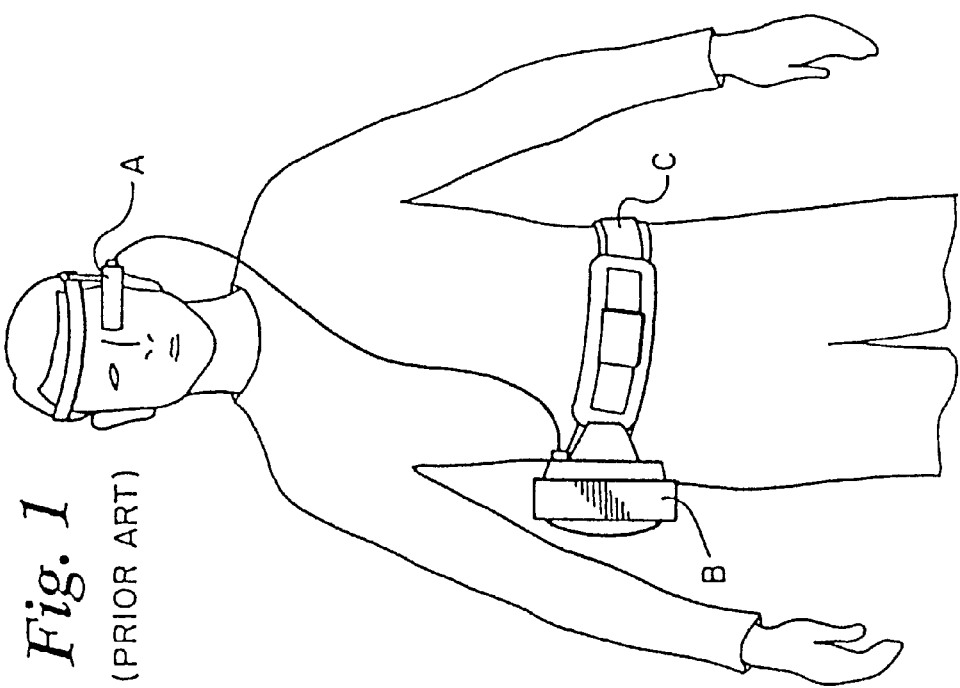
FIG. 1 is a perspective view of the prior art of a wearable portable computer system produced by Reddy Information Systems called Red.

| | Drawing Reference Numerals |
|---|---|
| A | Reflection Technologies Private Eye wearable display |
| B | Reddy Information Systems 1)05 rigid rectilinear personal computer and RAM card reader |
| C | Padded harness |
| D | NEC Corporation's personal computer and CD-ROM reader |
| E | NEC Corporation's input device |
| F | NEC Corporation's output device |
| 002A | Flexible circuit |
| 002B | Flexible circuit |
| 002C | Flexible circuit |
| 002D | Flexible circuit |
| 002E | Flexible circuit |
| 002F | Flexible circuit |
| 004 | Tensile load strap |
| 005A | Belt latch, male |
| 005B | Belt latch, female |
| 006 | Foam sheath |
| 010 | Module recess |
| 011A | Eyelet snap |
| 011B | Eyelet snap |
| 046 | Seam surface |
| 060 | Portable input/output device |
| 061 | I/O bus |
| 100 | Bus termination module |
| 112 | Bus termination resistors |
| 114 | Bus termination printed circuit board |
| 115 | Bus termination module solder pins |
| 116 | Bus termination plated via holes |
| 200 | Microprocessor module |
| 212 | Microprocessor |
| 212A | Microprocessor support components |
| 214 | Microprocessor printed circuit board |
| 215 | Microprocessor printed circuit board solder pins |
| 216 | Microprocessor plated via holes |
| 217 | Microprocessor module top shell |
| 218 | Microprocessor module bottom shell |
| 219 | Microprocessor module boss |
| 219 | Microprocessor module boss |
| 220 | Holes for microprocessor module assembly |
| 222 | Microprocessor module retention plate |
| 223 | Microprocessor module self tapping screw |
| 300 | RAM-I/O module |
| 314 | RAM-I/O printed circuit board |
| 317 | RAM-I/O module top shell |
| 322 | RAM-I/O module retention plate |
| 323 | RAM-I/O port bezel |
| 324 | Random access memory chips |
| 325 | RAM-I/O Module orifice |
| 326 | Output device port |
| 327 | Input device port |
| 328 | Communications port |
| 347 | Input/output processor |
| 347A | Support circuitry components |
| 400 | Mass memory module |
| 412 | Flash memory chip |
| 414 | Mass memory circuit board |
| 417 | Mass memory module top shell |
| 500 | Battery module |
| 508 | Battery bezel |
| 514 | Battery module printed circuit board |
| 517 | Battery module top shell |
| 523 | Battery nodule self tapping screw |
| 530 | Battery cartridge |
| 531 | Battery fixture |
| 533 | Voltage regulation components |

DESCRIPTION OF PREFERRED EMBODIMENTS

Referring now to the drawings, with particular attention to FIGS. 3–4, the method of using the flexible wearable computer is straightforward. The user adjusts the flexible wearable computer to fit comfortably around the waist by varying the connection of male and female belt latches 005A, 005B to a flexible tensile load strap 004. An input/output device 060 is a pen based liquid crystal display device that has a clip allowing easy attachment to a flexible compressive foam sheath 006 when not in use. The input/output device is connected to the processor and mass memory by an I/O bus 061.

FIG. 5 demonstrates the detail of the preferred embodiment. The computer is entirely encased in foam sheath 006 injection-molded out of antimicrobial microcellular polyurethane foam (such as PORON, available from Rogers Corporation), and varies in thickness from 0.140 inches thick to 0.250 inches thick, and is approximately 15.0 inches long. Flexible compressive foam sheath 006 necks (narrows) down at each end such that the opening in foam sheath 006 is the same width as tensile load strap 004. Tensile load strap 004 is a belt strap consists of woven aramid fibers (otherwise known as KEVLAR, available from Dupont), but could consist of common nylon strapping or thin steel stranded cables. Tensile load strap 004 is approximately 2.0 inches× 0.02 inches×47.0 inches. A port bezel 323 is adhered to foam sheath 006 with adhesive. It allows output device port 326, input device port 327, and communications port 328 to be exposed through foam sheath 006. A battery bezel 508 is adhered to foam sheath 006. Port bezel 323 and battery bezel 508 are all injection-molded out of ABS plastic.

Figure 7:
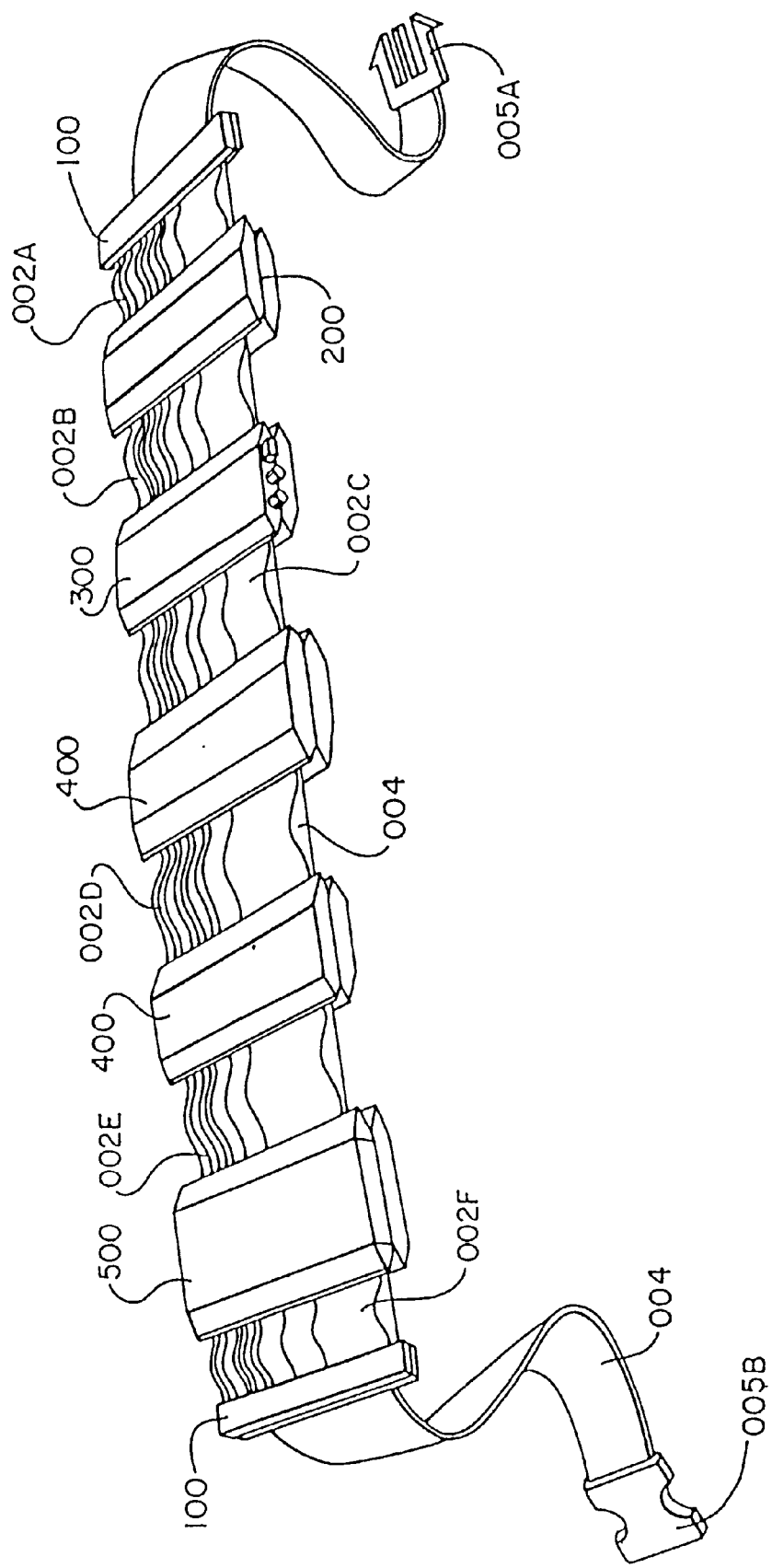
FIG. 7 is a perspective view of the flexible wearable computer with the outer sheath completely removed.

FIGS. 4 and 7 demonstrate the structure beneath foam sheath 006 of the preferred embodiment. Five different types of modules 100, 200, 300, 400, 500 are electrically connected to each other by polyamide (KAPTON, available from Dupont) flexible circuits 002A, 002B, 002C, 002D, 002E, 002F. Each computer component module 100, 200, 300, 400, 500 is affixed to the tensile load strap 004. The two-part belt latch 005A and 005B is connected to each end of tensile load strap 004.

Referring now to FIG. 6, the flexible wearable computer is demonstrated with foam sheath 006 partially open revealing a molded-in module recess 010 which is approximately 0.125 inches deep. Each module 100, 200, 300, 400, 500 is seated in a separate module recess 010. FIG. 6 also reveals that foam sheath 006 is fastened to tensile load strap 004 by a pair of eyelet snaps 011a and 011b, located at both narrowed ends of foam sheath 006. Seam surface 046 which run the bottom length of foam sheath 006, are fastened to each other with adhesive.

Microprocessor Module

Figure 8:
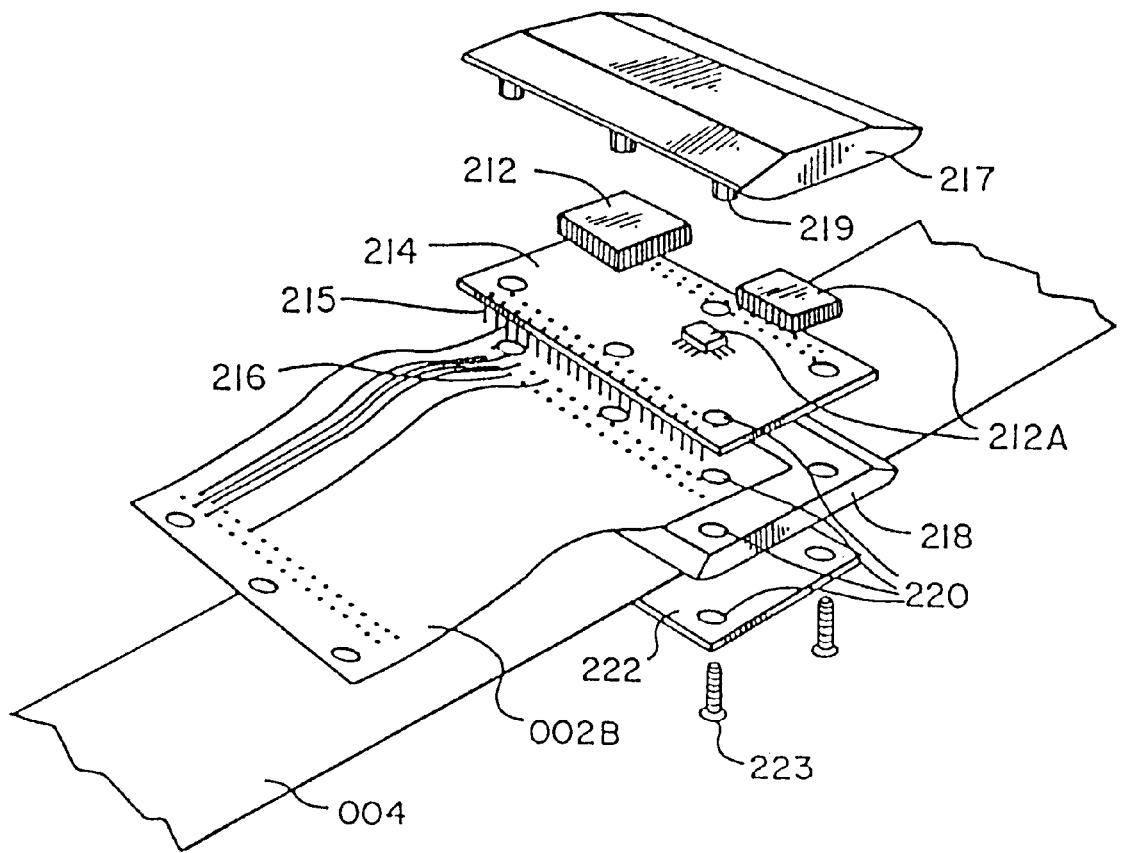
FIG. 8 is a perspective exploded assembly view of microprocessor module.

Referring to FIG. 8, the microprocessor module 200 is demonstrated. Microprocessor 212 and microprocessor support components 212A are of surface mount size, and are soldered to a microprocessor printed circuit board 214. The dimensions of microprocessor printed circuit board 214 are approximately 2.25 inches×1.55 inches×0.06 inches. At each of the long edges of microprocessor printed circuit board 214 are an array of microprocessor printed circuit board solder pins 215 which register with a corresponding array of plated via holes 216 on flexible circuit 002B. Solder pins 215 are soldered into plated via holes 16. Flexible circuit 002B and microprocessor printed circuit board 214 are sandwiched between a microprocessor module top shell 217 and microprocessor module bottom shell 218. Flexible circuit 002B is approximately 2.65 inches long×2.00 inches wide×0.006 inches thick. Microprocessor module bosses 219 extend from the microprocessor module top shell 217 through holes 220 in flexible circuit 002B and microprocessor printed-circuit board 214. The mechanical registration and therefore electrical connection of plated via holes 216 with solder pins 215 is held true by bosses 219.

Figure 9:
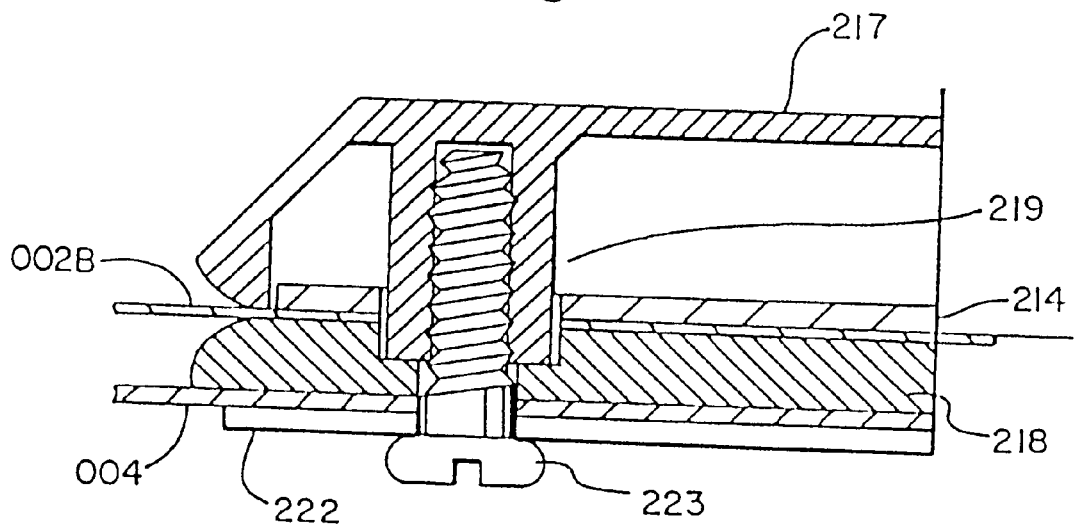
FIG. 9 is an orthographic cross sectional view of the microprocessor module.

Microprocessor module top shell 217 and bottom shell 218 are shown in cross-section in FIG. 9 as having approximately a 0.10 inch radius edge detail curving away from flexible circuit 002B. This feature provides a limit on the radius of curvature experienced by flexible circuit 002B. Tensile load strap 004 is fastened against microprocessor module bottom shell 218 by microprocessor module retention plate 222 and self-tapping screws 223. Self tapping screws 223 fasten the entire assembly together by screwing into bosses 219 on microprocessor module top shell 217.

RAM-I/O and Mass Memory Modules

Figure 10:
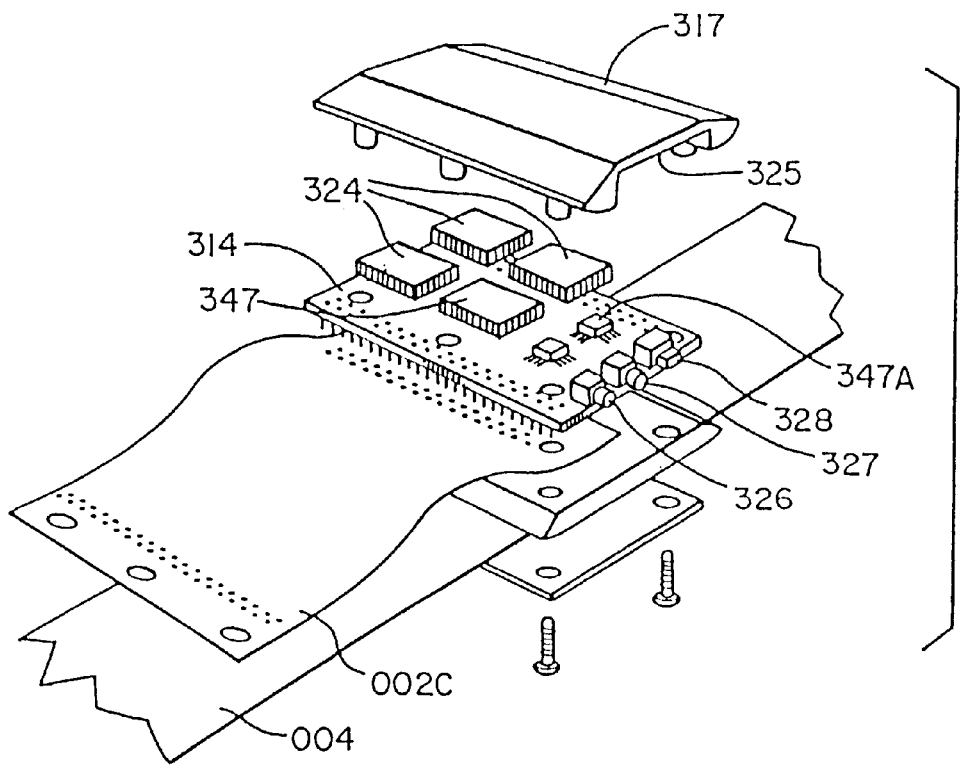
FIG. 10 is a perspective exploded assembly view of the RAM I/O module.

FIG. 10 demonstrates RAM-I/O module 300. It has the same basic construction as microprocessor module 200 except for two differences. First, instead of a microprocessor, random access memory chip 324 and input/output processor 347 and support circuitry components 347A, are soldered onto RAM-I/O circuit board 314. Second, output device port 326, input device port 327, and communications port 328 are electrically connected to RAM-I/O printed-circuit board 314, and extend through RAM-I/O module orifice 325 in RAM-I/O module top shell 317. Flexible circuit 002C is registered and fastened against RAM-I/O printed-circuit board 314 the same way as with the previously described microprocessor module 200. RAM-I/O module 300 is also connected to tensile load strap 004 in the same way as in previously described microprocessor module 200.

Figure 11:
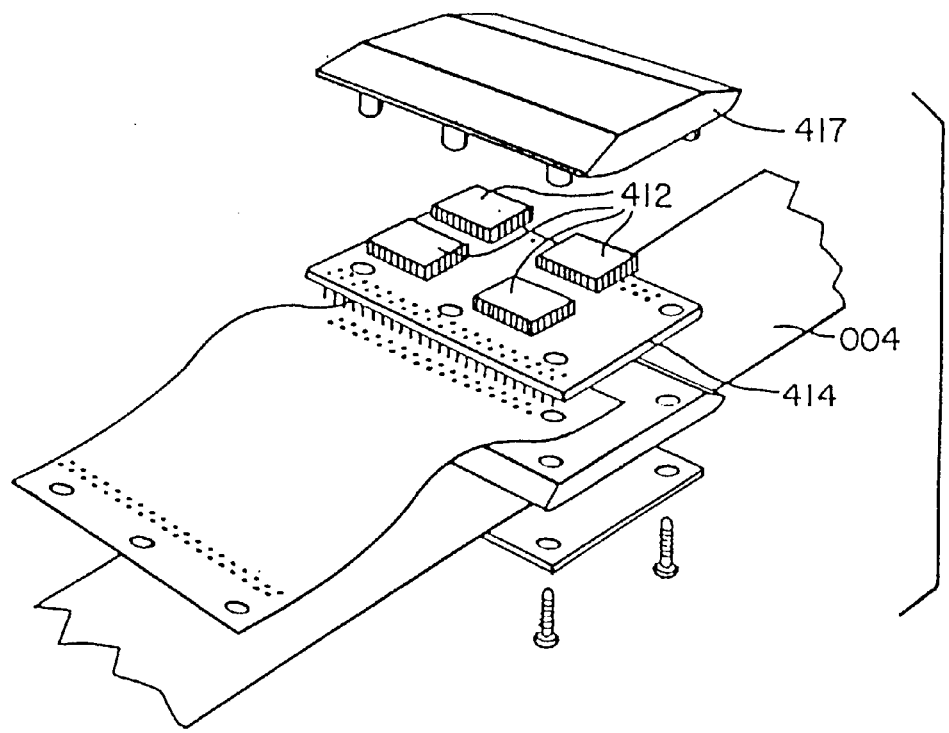
FIG. 11 is a perspective exploded assembly view of the mass memory module.

FIG. 11 demonstrates mass memory module 400. Multiple mass memory modules are shown in the preferred embodiment and are identical except for their software addresses, and have the same basic construction as microprocessor module 200 except for two differences. First, instead of a microprocessor, flash memory chip 412 (of which there are four) are soldered to printed-circuit board 414. Flexible circuits 002D, 002E are registered and fastened against printed-circuit board 414 the same was as in previously described modules 200. Mass memory modules 400 are also connected to tensile load strap 004 in the same way as in previously described module 200.

Battery and Bus Termination Modules

Figure 12:
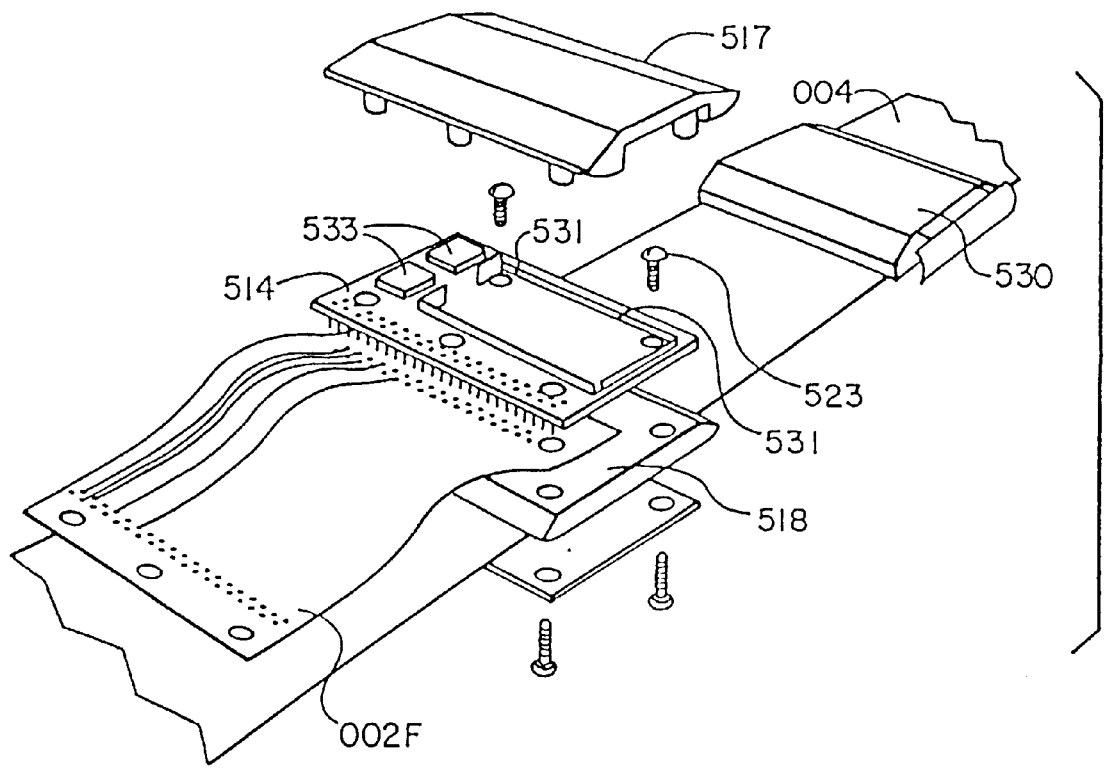
FIG. 12 is a perspective exploded assembly view of the battery module.

FIG. 12 demonstrates a battery module 500 containing a battery cartridge 530 held by a battery fixture 531, and a battery module top shell 517. Battery fixture 531 is fastened onto a printed-circuit board 514 with a screw 523. Voltage regulation components 533 are of surface mount size, and are soldered to printed-circuit board 514. Flexible circuit 002F is registered and fastened against printed-circuit board 514 the same was as in previously described module 200. Module top shell 517 and module bottom shell 518 are fastened the same way as in previously described module 200. Battery module 500 is also connected to tensile load strap 004 in the same way as in previously described module 200.

Figure 13:
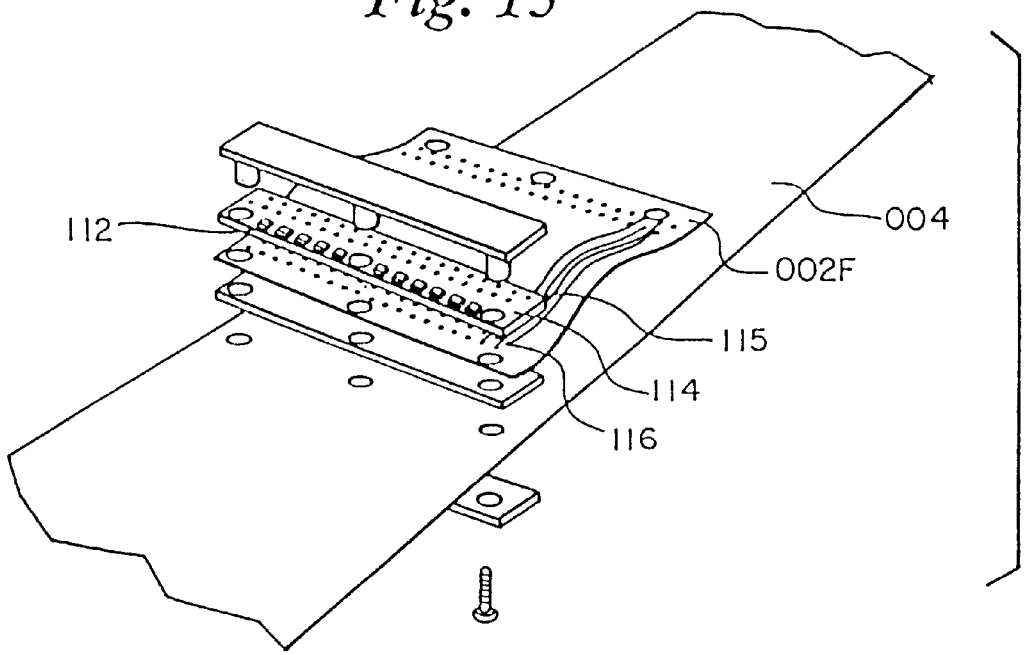
FIG. 13 is an exploded assembly view of the bus termination module.

A bus termination module 100 is shown in FIG. 13. Bus termination resistors 112 are of surface mount size and soldered to a bus termination circuit board 114. Bus termination circuit board 114 measures approximately 2.00 inches×0.30 inches×0.06 inches. Bus termination circuit board 114 has an array of bus termination module solder pins 115 along one long edge which register with bus termination plated via holes 116 on flexible circuit 002F. Flexible circuits 002A and 002F measure approximately I.S inches long×2.00 inches wide×0.006 inches. Bus termination module 100 is connected to tensile load strap 004 in the same way as in previously described module 200.

SUMMARY, RAMIFICATIONS AND SCOPE

Accordingly, the reader will see that the flexible computer has the advantage of increasing the service level of portable computer hardware while also increasing the comfort of using the hardware. In addition, the flexible wearable computer has the advantages of:

accommodating a wide variety of human morphologies;

allowing hands-free carrying and operation;

allowing the user to comfortably sit or lie while wearing the device;

allowing the weight of the computer to be symmetrically distributed on the body;

eliminating the muscle and tendon strain associated with carrying rigid rectilinear computers;

increasing the compliance of field service personnel that must use a computer;

allowing significantly larger amounts of secondary flash memory to be comfortably carried by the user;

allowing expansion more easily and comfortably than rigid designs; and increasing the ruggedness of a mobile wearable computer by decreasing the area of the rigid elements, thereby decreasing the bending moment across each element.

Although the description above contains many specificities, these should not be construed as limiting the scope of the invention, but merely providing illustration of some of the presently preferred embodiments of this invention. The flexible wearable computer could be implemented in many different ways. For example, each module could be potted with a solid thermoset plastic rather than have a two part shell. The flexible tensile load bearing means could consist of individually twisted aramid fibers encased in the potting compound. The flexible tensile load bearing means could be fibers woven into cloth or even a homogeneous thin layer of material. The flexible signal relaying means could be glued or otherwise permanently attached to the tensile load bearing means.

Components and support circuitry need not be surface mount size and soldered. The components may be affixed to the circuit board with conductive epoxy. The computer may be made even thinner and more flexible by implementing it using chip-on-board manufacturing technology. Each integrated circuit would be bonded directly to a small printed circuit board and the terminals would be electrically connected to the board. Each IC would be covered with an epoxy dab. Each discrete circuit board module could be as small as a 0.5 square inch.

The computer could be implemented as one long multi-layer polyamide flexible, or rigid-flex, circuit board. As an entirely flexible board, the module shells would rigidify the areas populated with electronic components. As a rigid-flex design, the sections with electronic components would be laminated with rigid fiberglass board stiffeners.

The flexible signal relaying means could be discrete wires or discrete non metallic filaments. It could be produced with ink traces or any type of non-metallic, flexible conductive material. The computer could be implemented as a fiber optic device. The flexible circuit could be optical fiber filaments instead of metallic or non-metallic conductors. Also, the flexible signal relaying means could be an easily detachable and re-attachable bus that is disposable.

Figure 14:
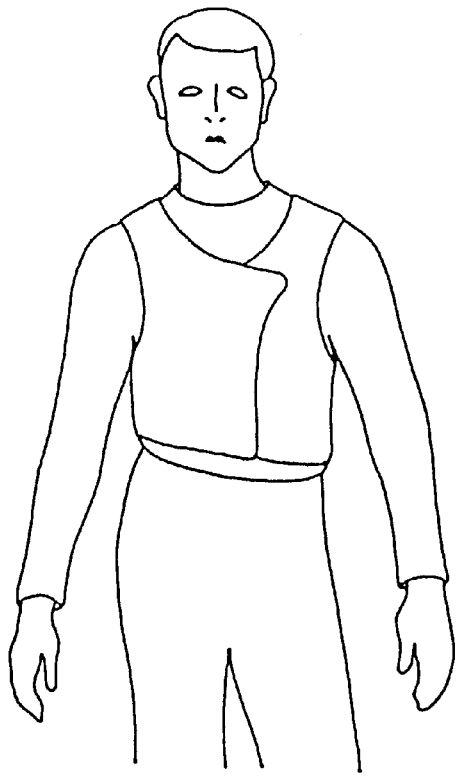
FIG. 14 is a perspective view of an alternative embodiment of the flexible wearable computer in the form of a vest.
Figure 15:
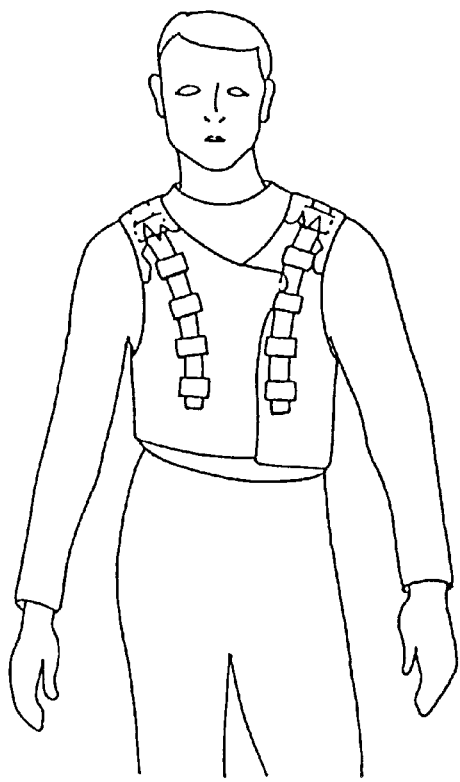
FIG. 15 is a perspective view of the alternative embodiment in the form of a vest with the outer sheath ghosted.
Figure 16:
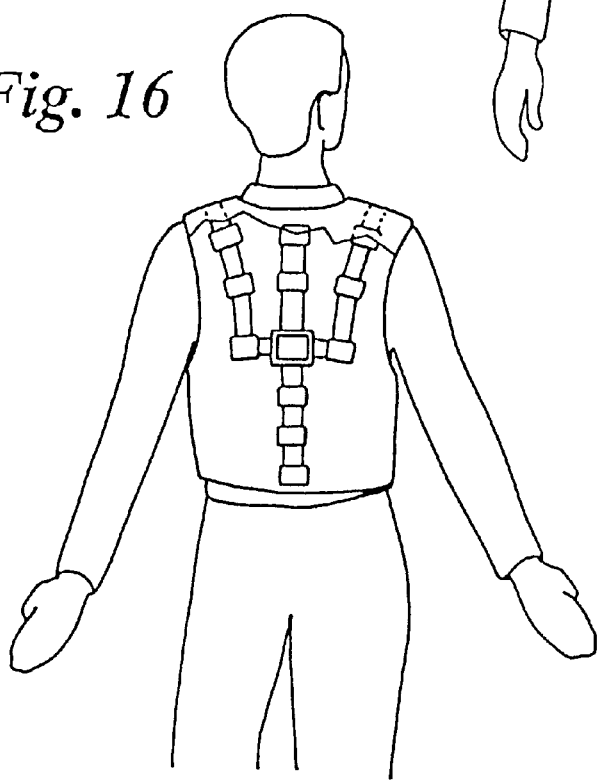
FIG. 16 is a rear perspective view of the alternative embodiment in the form of a vest with the outer sheath ghosted.

Furthermore, the configuration of the flexible wearable computer need not be in a belt. The module and bus assembly can be fashioned in a variety of ways. FIG. 14 demonstrates an alternative embodiment of the flexible wearable computer in the shape of a vest for increasing the number of elements for computing. FIG. 15 shows the foam sheath of the vest removed revealing an increased number of modules. FIG. 16 demonstrates the bus arrangement to accommodate the increased number of modules thereby greatly expand the memory and processing capacity of the flexible wearable computer.

Figure 17:
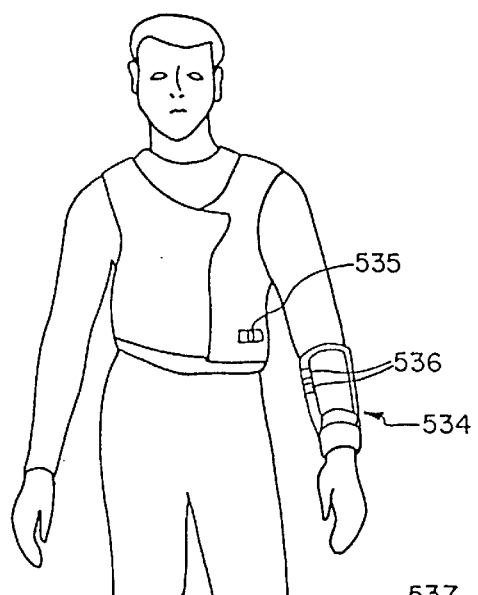
FIG. 17 is a schematic perspective view of the user wearing the flexible wearable computer system in the form of a vest with a touch sensitive flexible LCD output device worn wrapped around the forearm.

Referring now to FIG. 17, the computer is shown there in the form of a vest. The output device is a touch sensitive flexible LCD 534 worn on the forearm. The wearer controls the computer by touching virtual graphical elements on the LCD with the right hand. There is an infra-red wireless data link between the computer and the LCD via infra-red transceivers 535 and 536.

Figure 18:
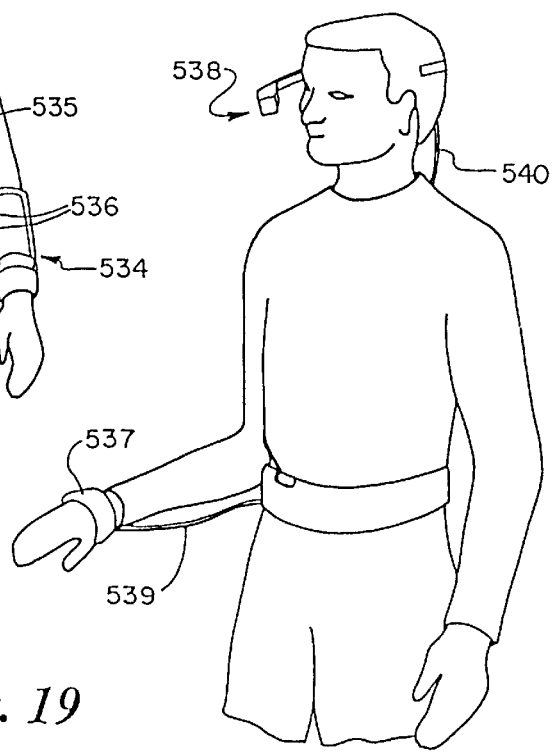
FIG. 18 is a schematic perspective view of the user wearing the flexible wearable computer system in the form of a belt with a hand-mounted free-space pointer input device.

FIG. 18 demonstrates a configuration with the computer in the form of a belt, a free-space pointer input device 537 and a Private Eye heads-up display 538 as the output device. A free-space pointer, such as a GyroPoint, translates relative three-dimensional motion of the hand into digital pulses which are monitored by the computer. Software drivers translate the digital pulses into corresponding movements of the cursor in the virtual screen generated by the heads-up display. Both the free-space pointer 537 and the heads-up display 538 are functionally connected to the computer via tethers 539 and 540.

Figure 19:
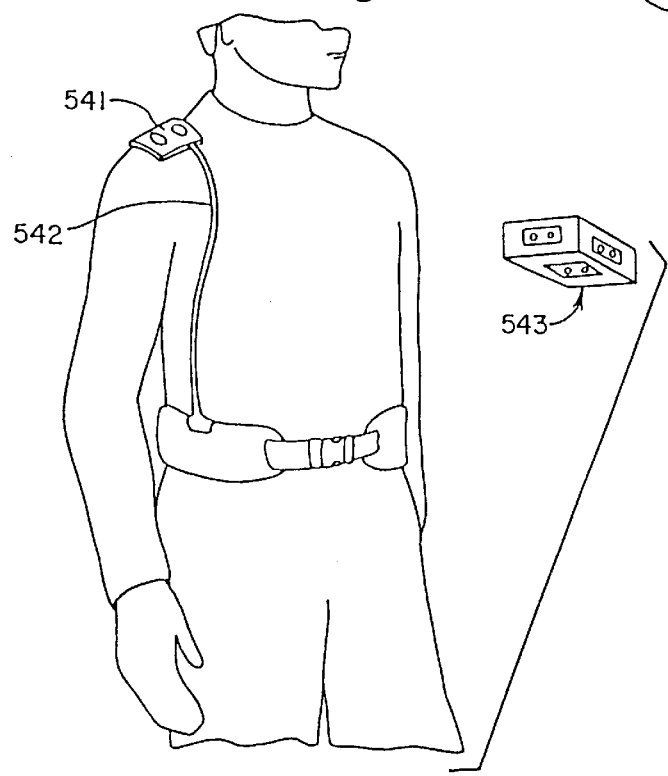
FIG. 19 is a schematic perspective view of the user wearing the flexible wearable computer system in the form of a belt with a tethered infra-red transceiver worn on the shoulder.

FIG. 19 shows a method of wirelessly connecting the computer, in the form of a belt, to a Local Area Network (LAN). An infra-red transceiver 541, such as Photonics Infra-red Transceiver, is functionally connected to the computer via a tether 542. The transceiver communicates via infra-red pulses with a plurality of infra-red repeaters 543 mounted overhead in the environment. Wireless communication could also be of radio-frequency type in which case the computer receiver would be included as a disintegrated module as shown in FIG. 15.

Figure 20:
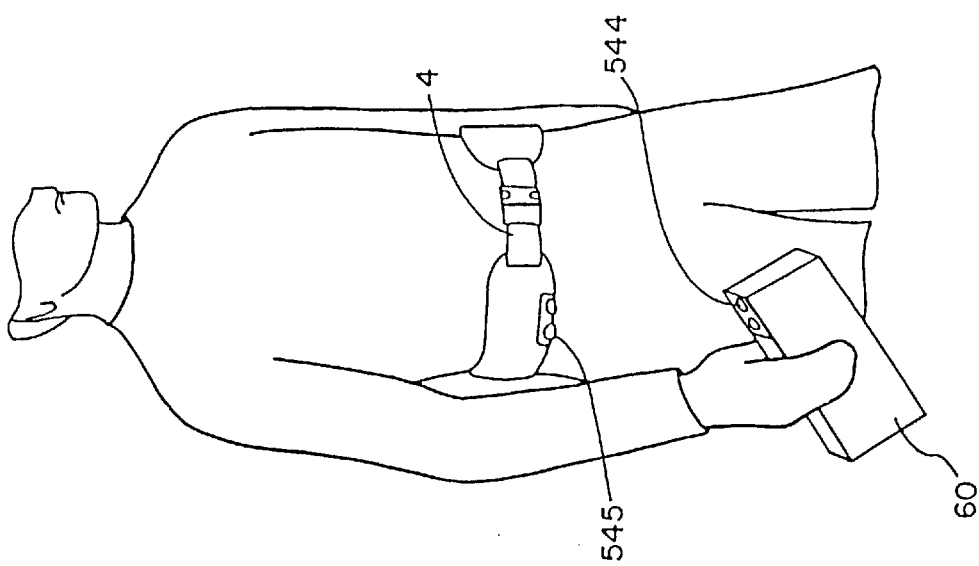
FIG. 20 is a schematic perspective view of the user wearing the flexible wearable computer system in the form of a belt with a wireless infra-red transceiver communication link between the belt and a hand held pen based display device.

In FIG. 20, the configuration is the same as FIG. 3, but instead of a hardwired connection, both the computer and pen-based display device 60 have wireless infra-red pulse transceivers 544 and 545. The pen-based display 60 sends pen location data to the computer and the computer sends corresponding graphical information to the pen-based device 60.

Figure 21:
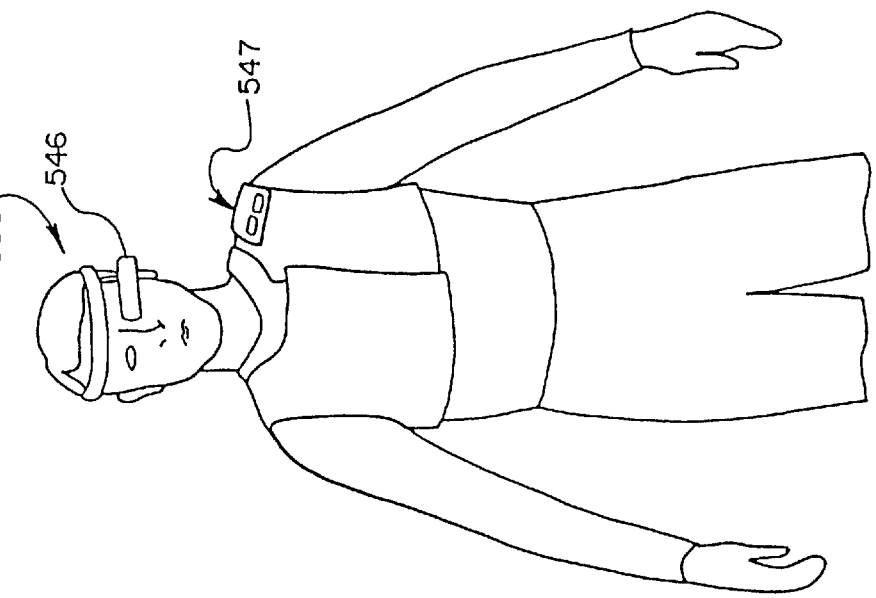
FIG. 21 is a schematic perspective view of the user wearing the flexible wearable computer system in the form of a vest with a wireless infra-red transceiver communication link between the best and a heads-up display.

FIG. 21 demonstrates a wireless infra-red communication link between a Private Eye heads-up display 538 and the computer. An infra-red receiver 546 is located on the heads-up display. An infra-red transceiver 547 is located in the shoulder area of the computer.

Figure 22:
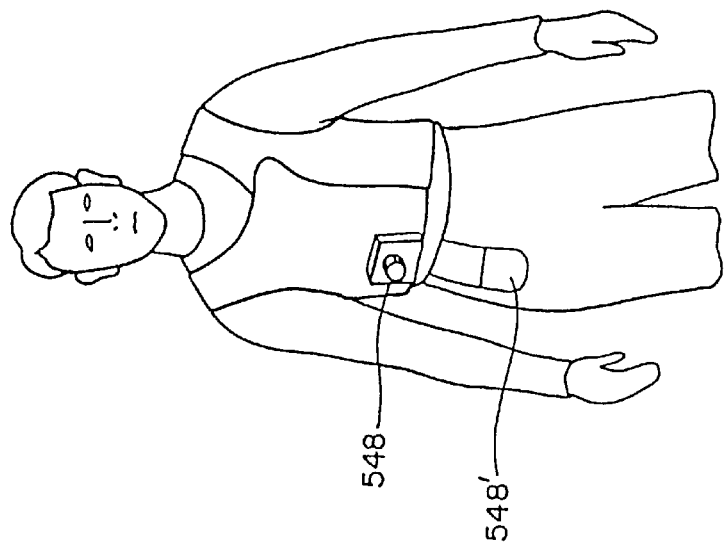
FIG. 22 is a schematic perspective view of the user wearing the flexible wearable computer system in the form of a vest with a projection display mounted to it.

In FIG. 22, an LCD projection display 548 is mounted on the front abdominal area of the computer, which is in the form of a vest. This device works by projecting a strong light through an LCD that is controlled by a computer, and then through a focusing lens. The LCD projection display 548 projects a computer generated image of any reflective, flat surface, such as a reflection pad 548' hanging from the user's waist, or the user's palm. To view the computer's output, the user would hold up the reflection pad 548' or the palm in the path of the image that is being projected. The image is reflected and thus readable to the user.

Figure 23:
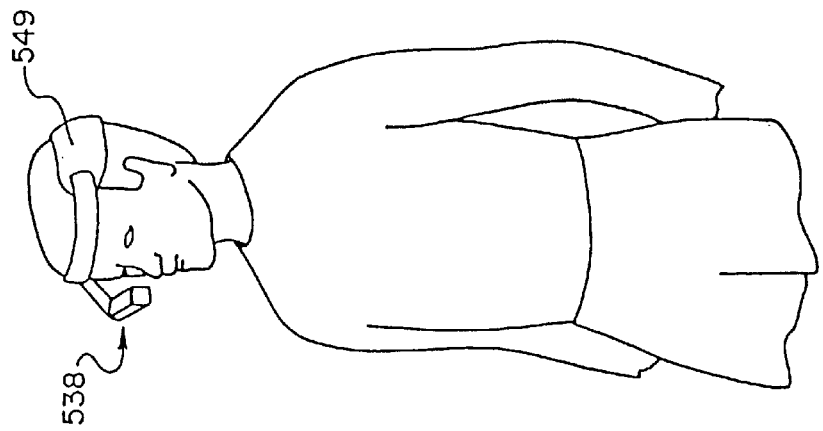
FIG. 23 is a schematic perspective view of the user wearing the flexible wearable computer system in the form of a headband with a heads-up display mounted to it.

FIG. 23 shows the wearable computer system in the form of a headband 549 with an attached heads-up display 538.

Figure 24:
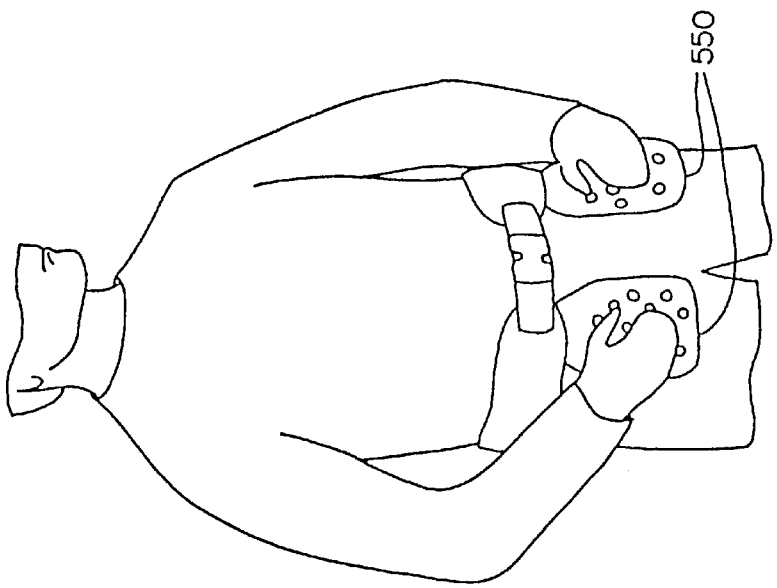
FIG. 24 is a schematic perspective view of the user wearing the flexible wearable computer system in the form of a belt with a split QWERTY keyboard input device mounted to it.

FIG. 24 shows the computer in the form of a belt with a split QWERTY keyboard 550 attached to the computer so that it hangs downward in front of the user and can be easily reached. The user types in commands just as he would at a desk top keyboard.

Figure 25:
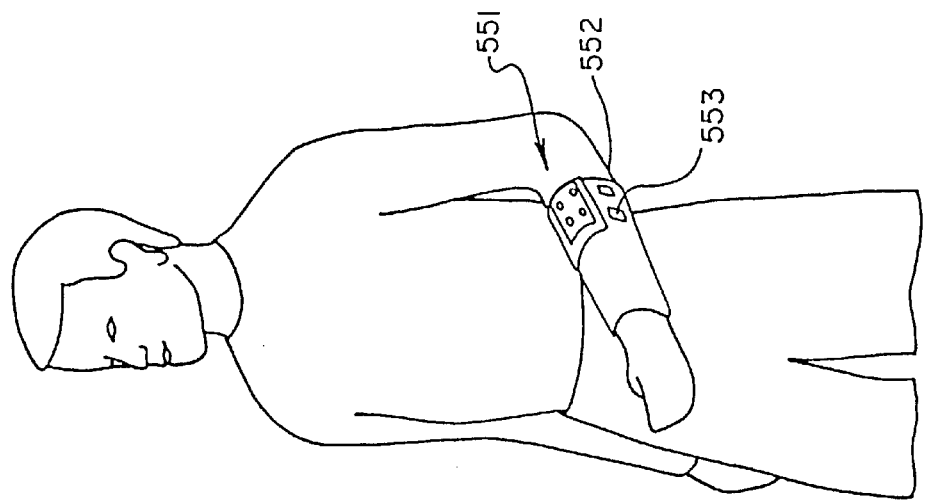
FIG. 25 is a schematic perspective view of the user wearing the flexible wearable computer system in a form that wraps around the forearm.

FIG. 25 shows the computer implemented as a flexible form that wraps around the forearm. The user interface consists of a keypad 551 and speech recognition and speech synthesis capability. A microphone 552 and speaker 553 are included in the computer.

Figure 26:
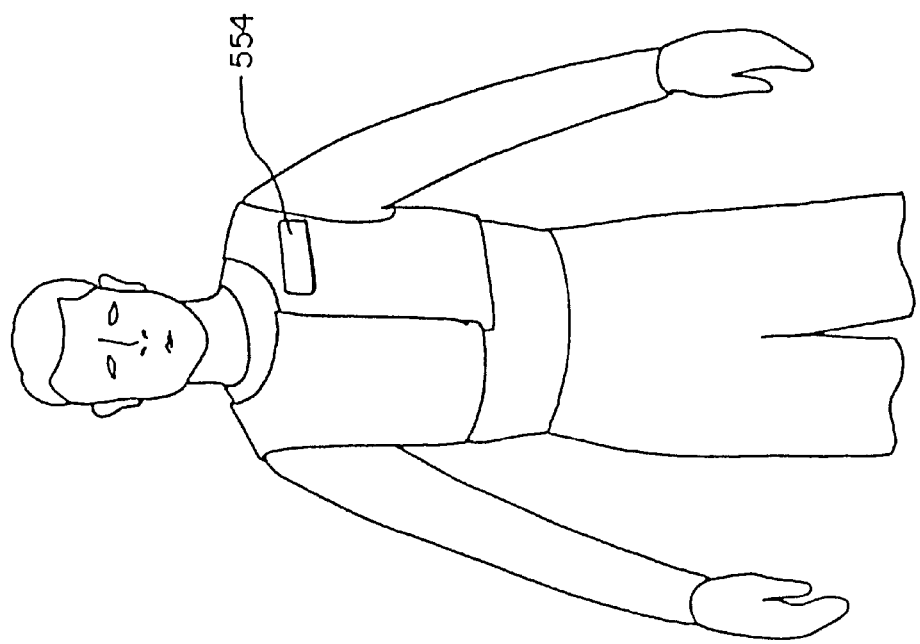
FIG. 26 is a schematic perspective view of the user wearing the flexible wearable computer system in the form of a vest with a heads-up display mounted in the breast area.

FIG. 26 shows the computer in the form of a vest with a Private Eye heads-up display 554 mounted on the left breast.

To access the graphical output of the computer, the user looks down and to the left into the heads-up display 554.

Figure 27:
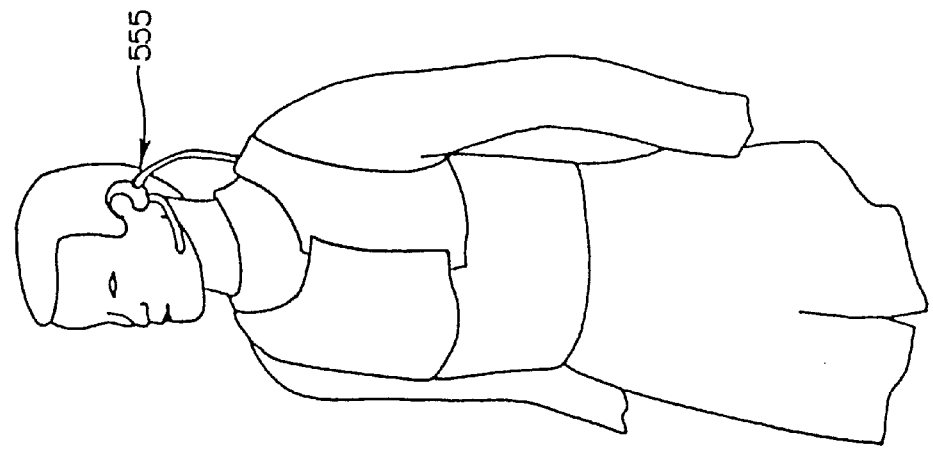
FIG. 27 is a schematic perspective view of the user wearing the flexible wearable computer system in the form of a vest with an ear clip speaker and microphone input/output device tethered to it.

FIG. 27 shows the computer in the form of a vest with an ear clip microphone/speaker device 555. The method of controlling the computer is speech recognition. The output from the computer to the wearer is speech synthesis. This configuration allows only the wearer to hear the output from the computer, and to speak at low volumes when inputting commands.

Figure 28:
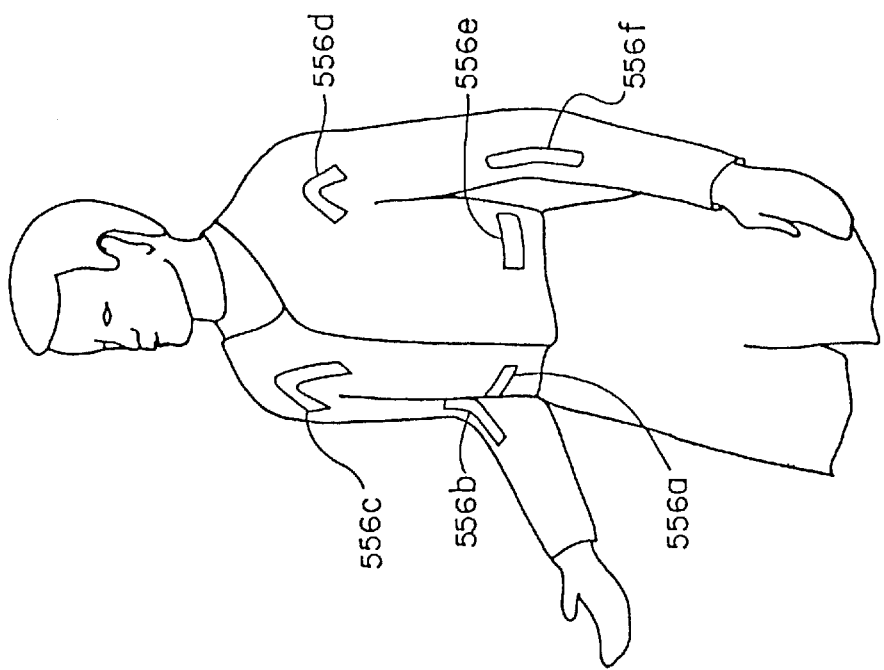
FIG. 28 is a schematic perspective view of the user wearing the flexible wearable computer system in the form of a garment with motion sensors integrated into the garment.

FIG. 28 shows the computer in the form of a garment with motion sensors 556a, b, c, d, e and f. The computer continually polls these sensors. The data from these sensors is used by the computer as input to drive software that would interpret the data from the sensors as certain gestures. These gestures can be used to control the computer. For example, the user may be able to switch the computer into a mode where it is listening for the wearer's voice input simply by making a circular motion with the left arm. A circular motion in the opposite direction would switch off the listen mode.

Figure 29:
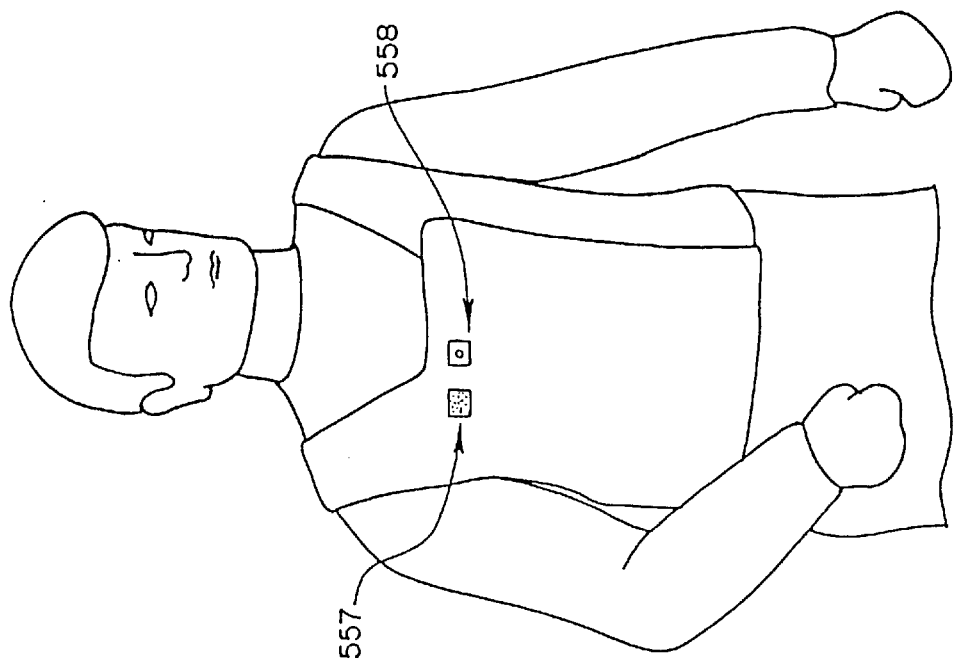
FIG. 29 is a schematic perspective view showing the computer in a totally hands-free operation.

FIG. 29 illustrates the invention in a totally hands-free operation. The computer is in vest form and incorporates a speech recognition and/or speech synthesis interface including a microphone 557 and a speaker 558. In this configuration, the need for rigid interface hardware such as keyboards or liquid crystal displays is obviated.

Many of the various interface peripherals can be used in combination with each other. For example, the arm mounted flexible LCD shown in FIG. 17 could be used as the output device and voice recognition could be used as the input device. Or, referring to FIG. 25, the flexible wearable computer worn on the forearm could be controlled with voice recognition.

Thus the scope of the invention should be determined by the appended claims and their legal equivalents, rather than by the examples given.

What is claimed is:

1. A wearable computer, comprising:
   a processor module comprising a processing device for carrying out processing functions for the wearable computer;
   a memory module comprising memory for storage functions for the wearable computer, the memory being operatively coupled with the processing device;
   a power module comprising a power source for the wearable computer, the power source being operatively coupled with the processing device and the memory;
   an input-output module comprising an input-output device for input and/or output functions for the wearable computer, the input-output device being operatively coupled with the processor;
   a wireless communication device operatively coupled with the processor for wireless communication; and
   a flexible signal-carrying device, the flexible signal-carrying device transmitting signals between at least two of the modules, the flexible signal-carrying device passing into said at least two modules.

2. The wearable computer of claim 1, wherein the processor module comprises a processor-module top portion and a processor-module bottom portion, the flexible signal-carrying device passing between the processor-module top portion and the processor-module bottom portion.

3. The wearable computer of claim 2, wherein the flexible signal-carrying device passes through opposite ends of the processor module between the processor-module top portion and the processor-module bottom portion.

4. The wearable computer of claim 1, wherein the flexible signal-carrying device passes through opposite ends of the processor module.

5. The wearable computer of claim 1, further comprising a user interface for receiving input from and/or providing output to a user of the wearable computer, the wireless communication device being in wireless communication with the user interface.

6. The wearable computer of claim 5, wherein the user interface comprises structure for mounting on the user's body.

7. The wearable computer of claim 6, wherein the user interface comprises a heads-up display.

8. The wearable computer of claim 1, wherein the wireless communication device is in wireless communication with a local area network.

9. The wearable computer of claim 1, wherein the wireless communication device communicates via radio frequency.

10. The wearable computer of claim 1, wherein the wireless communication device comprises an infrared transceiver.

11. The wearable computer of claim 1, further comprising a cover for covering the flexible signal-carrying device between said at least two modules.

12. The wearable computer of claim 11, wherein the cover is separated from said at least two modules.

13. The wearable computer of claim 1, wherein the processor module, memory module, power module and input-output module are all separated from each other.

14. A wearable computer, comprising:
a processing device for carrying out processing functions for the wearable computer;
memory for storage functions for the wearable computer, the memory being operatively coupled with the processing device;
a power source for the wearable computer, the power source being operatively coupled with the processing device and the memory;
an input-output device for input and/or output functions for the wearable computer, the input-output device being operatively coupled with the processor;
a wireless communication device operatively coupled with the processor for wireless communication;
at least two modules for housing the processing device, memory, and/or power source, and
a flexible signal-carrying device, the flexible signal-carrying device transmitting signals between said at least two modules, the flexible signal-carrying device passing into said at least two modules.

15. The wearable computer of claim 14, wherein the wireless communication device is disposed outside said at least two modules.

16. The wearable computer of claim 14, wherein the flexible signal-carrying device passes entirely through at least one of the modules.

17. The wearable computer of claim 14, wherein the flexible signal-carrying device comprises flexible circuitry.

18. The wearable computer of claim 14, wherein the wearable computer is in the form of a belt.

19. The wearable computer of claim 14, wherein the wireless communication device is in communication with a peripheral.

20. The wearable computer of claim 14, wherein the wireless communication device communicates via radio frequency.

21. A flexible computing device for support by the human body, the flexible computing device comprising:
an input portion, the input portion adapted to provide communication with a keyboard;
an output portion, the output portion adapted to provide communication with a display;
a processing portion operably coupled to the input portion and the output portion, the processing portion adapted to perform processing functions;
at least one flexible signal relaying portion operably connecting at least the input portion and the output portion for conducting electrical signals therebetween; and
a cover, the cover at least partially covering the input portion, the output portion, and the at least one flexible signal relaying portion, the cover being one-piece over the input portion, the output portion, and the at least one flexible signal relaying portion, the cover being constructed for support by the human body.

22. The flexible wearable computing device of claim 21, wherein the cover defines at least two openings therethrough, one of the openings being associated with the input portion and the other of the openings being associated with the output portion.

23. The flexible wearable computing device of claim 22, wherein the cover is foldable.

24. The flexible wearable computing device of claim 21, wherein the at least one flexible signal relaying portion comprises flexible circuitry.

25. The flexible wearable computing device of claim 21, wherein at least a portion of the flexible wearable computing device is constructed to be handheld.

26. The flexible wearable computing device of claim 21, wherein the flexible wearable computing device is constructed to be comfortable to wear while the human body is against a firm surface.

27. The flexible wearable computing device of claim 21, further comprising a battery portion operably coupled to the processing portion.

28. The flexible wearable computing device of claim 27, wherein the battery portion is disposed at least partially within the cover.

29. The flexible wearable computing device of claim 21, further comprising a belt constructed to support the flexible wearable computing device on the human body.

* * * * *

UNITED STATES PATENT AND TRADEMARK OFFICE
CERTIFICATE OF CORRECTION

PATENT NO. : 6,108,197  
DATED : August 22, 2000  
INVENTOR(S) : Craig M. Janik

Page 1 of 1

It is certified that error appears in the above-identified patent and that said Letters Patent is hereby corrected as shown below:

Title page,
Item [56], "OTHER PUBLICATIONS" section has been changed to:

"Wearable Interconnection for Portable Computers"; IBM Technical Disclosure Bulletin; vol. 34, No. 10B, Mar. 1992, p. 30.
Helm, Leslie; "Japan Turns Fanciful in the Evolution of Computers;" Los Angeles Times; Oct. 14, 1991; Business Section; p. 1, Part D, column 2.
"Die Hände werden frei"; Nachtrichten Elektronik and Telematrik; vol. 44, No. 4, Apr. 1990, Heidelberg DE, p. 154.
"Known-Good Die: A Key to Cost-Effective MCMs", Electronic Packaging & Production; Sept. 1992, pp. 50-51.

Column 2,
Line 14, "commuter" has been changed to -- computer --.

Signed and Sealed this

Thirtieth Day of October, 2001

Attest:

NICHOLAS P. GODICI  
Attesting Officer     Acting Director of the United States Patent and Trademark Office